(12) United States Patent
Xing et al.

(10) Patent No.: US 12,387,774 B2
(45) Date of Patent: Aug. 12, 2025

(54) SPINTRONIC DEVICE, MEMORY CELL, MEMORY ARRAY AND READ AND WRITE CIRCUIT

(71) Applicant: INSTITUTE OF MICROELECTRONICS, CHINESE ACADEMY OF SCIENCES, Beijing (CN)

(72) Inventors: Guozhong Xing, Beijing (CN); Di Wang, Beijing (CN); Long Liu, Beijing (CN); Huai Lin, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/251,699

(22) PCT Filed: Oct. 13, 2021

(86) PCT No.: PCT/CN2021/123529
§ 371 (c)(1),
(2) Date: May 3, 2023

(87) PCT Pub. No.: WO2023/060475
PCT Pub. Date: Apr. 20, 2023

(65) Prior Publication Data
US 2024/0013826 A1 Jan. 11, 2024

(51) Int. Cl.
*G11C 11/16* (2006.01)
*G06F 17/16* (2006.01)
(Continued)

(52) U.S. Cl.
CPC ............ *G11C 11/161* (2013.01); *G06F 17/16* (2013.01); *G11C 11/1655* (2013.01);
(Continued)

(58) Field of Classification Search
CPC .............. G11C 11/161; G11C 11/1655; G11C 11/1657; G11C 1/1675; G11C 11/1675
See application file for complete search history.

(56) References Cited

U.S. PATENT DOCUMENTS 10,381,406 B1 * 8/2019 Jacob .................. G11C 11/1673
2018/0114557 A1 * 4/2018 Park .................... G11C 11/5607
(Continued)

FOREIGN PATENT DOCUMENTS

CN 110660420 A 1/2020
CN 112002722 A 11/2020
(Continued)

OTHER PUBLICATIONS

International Search Report and Written Opinion dated Jun. 23, 2022, for corresponding PCT Application No. PCT/CN2021/123529.

*Primary Examiner* — Han Yang
(74) *Attorney, Agent, or Firm* — Kinney & Lange, P.A.

(57) ABSTRACT

Provided is a spintronic device, a memory cell, a memory array, and a read and write circuit applied in a field of integration technology. The spintronic device includes: a bottom electrode; a spin orbit coupling layer, arranged on the bottom electrode; at least one pair of magnetic tunnel junctions, arranged on the spin orbit coupling layer, wherein each of the magnetic tunnel junctions includes a free layer, a tunneling layer, and a reference layer arranged sequentially from bottom to top, and wherein magnetization directions of reference layers of two magnetic tunnel junctions of each pair of the magnetic tunnel junctions are opposite; and a top (Continued)

electrode, arranged on a reference layer of each of the magnetic tunnel junctions.

6 Claims, 7 Drawing Sheets

(51) Int. Cl.
*H10B 61/00* (2023.01)
*H10N 50/20* (2023.01)

(52) U.S. Cl.
CPC ...... *G11C 11/1657* (2013.01); *G11C 11/1675* (2013.01); *H10B 61/22* (2023.02); *H10N 50/20* (2023.02)

(56) References Cited

U.S. PATENT DOCUMENTS

| | | | |
|---|---|---|---|
| 2019/0088860 A1* | 3/2019 | Saito | H10N 50/80 |
| 2020/0235289 A1* | 7/2020 | Alam | H10N 50/80 |
| 2021/0193912 A1 | 6/2021 | Gupta et al. | |
| 2021/0210127 A1* | 7/2021 | Drouard | G11C 11/161 |
| 2024/0005974 A1* | 1/2024 | Xing | G11C 11/161 |

FOREIGN PATENT DOCUMENTS

| | | |
|---|---|---|
| CN | 112382319 A | 2/2021 |
| CN | 113450850 A | 9/2021 |

\* cited by examiner

SPINTRONIC DEVICE, MEMORY CELL, MEMORY ARRAY AND READ AND WRITE CIRCUIT

CROSS-REFERENCE TO RELATED APPLICATION

This application is a Section 371 National Stage Application of International Application No. PCT/CN2021/123529, filed on Oct. 13, 2021, entitled "SPINTRONIC DEVICE, MEMORY CELL, MEMORY ARRAY AND READ AND WRITE CIRCUIT", the content of which is hereby incorporated by reference in its entirety.

TECHNICAL FIELD

The present disclosure relates to a field of integrated circuits, and in particular, to a spintronic device, a memory cell, a memory array, and a read and write circuit.

BACKGROUND

A spin orbit torque magnetic random access memory (SOT-MRAM) switches a magnetization direction of a free layer through a spin current in a vertical direction induced by a current flowing through a heavy metal layer, and respectively achieves a low resistance state and a high resistance state according to the parallel or antiparallel arrangement of magnetization directions of the free layer and the reference layer. Meanwhile, the SOT-MRAM has the advantages of high speed and high endurance, which provides the possibility for integrated storage and computing applications. However, the switching of the traditional SOT-MRAM requires an assistance of an in-plane field, which is not conducive to integration. Moreover, a tunneling magnetoresistance (TMR) ratio of a magnetic tunnel junction (MTJ) is low, and generally only reaches 100%-150%, which makes a process fluctuation lead to a greater probability of misreading.

SUMMARY

The main objective of the present disclosure is to provide a spintronic device, a memory cell, a memory array, and a read and write circuit without an external field switching and with a high read and write margin.

In order to achieve the above objective, according to a first aspect of the embodiments of the present disclosure, there is provided a spintronic device, including:
  a bottom electrode;
  a spin orbit coupling layer arranged on the bottom electrode;
  at least one pair of magnetic tunnel junctions arranged on the spin orbit coupling layer, wherein each of the magnetic tunnel junctions includes a free layer, a tunneling layer, and a reference layer arranged sequentially from bottom to top, and magnetization directions of reference layers of two magnetic tunnel junctions of each pair of the magnetic tunnel junctions are opposite; and
  a top electrode arranged on a reference layer of each of the magnetic tunnel junctions.

In an embodiment, a structure of each of the magnetic tunnel junctions is a string-shaped structure.

In an embodiment, an axis of a straight side of each of the magnetic tunnel junctions forms a preset included angle with an axis of a length direction of the spin orbit coupling layer.

In an embodiment, the bottom electrode includes:
  a first electrode, connected to a first end of the spin orbit coupling layer; and
  a second electrode, connected to a second end of the spin orbit coupling layer;
  wherein the first end and the second end of the spin orbit coupling layer are arranged opposite to each other.

In an embodiment, a material of the spin orbit coupling layer is a heavy metal material.

According to a second aspect of the embodiments of the present application, there is provided a memory cell, including:
  the spintronic device according to the first aspect of the embodiments of the present application;
  a first transistor, including a first terminal, a second terminal and a third terminal, wherein the first terminal of the first transistor is connected to one end of the bottom electrode, the second terminal of the first transistor is connected to a write word line, the third terminal of the first transistor is connected to a bit line, and the other end of the bottom electrode is connected to a source line;
  a second transistor, including a first terminal, a second terminal and a third terminal, wherein the first terminal of the second transistor is connected to one top electrode for a pair of magnetic tunnel junctions, the second terminal of the second transistor is connected to a read word line, and the third terminal of the second transistor is connected to the bit line; and
  a third transistor, including a first terminal, a second terminal and a third terminal, wherein the first terminal of the third transistor is connected to another top electrode for the pair of magnetic tunnel junctions, the second terminal of the third transistor is connected to the read word line, and the third terminal of the third transistor is connected to an inverse bit line.

According a thirst aspect of the present disclosure, there is provided a memory array, including: m write word lines, m read word lines, n source lines, and m rows and n columns of memory cells, wherein the memory cell is the memory cell according to the second aspect of the embodiments of the present disclosure, each of m and n is a positive integer;
  a bit line for each of the memory cells in a same column is connected to a same bit line, and an inverse bit line for each of the memory cells in a same column is connected to s same inverse bit line; and
  a write word line for each of the memory cells in a same row is connected to a same write word line, and a read word line for each of the memory cells in a same column is connected to a same read word line.

According to a fourth aspect of the embodiments of the present disclosure, there is provided a read and write circuit, including:
  the memory array according to the third aspect of the embodiments of the present disclosure;
  a bit line decoder, configured to provide a bit line operating voltage to n bit lines and n inverse bit lines;
  a word line decoder, configured to provide a word line operating voltage to m write word lines and m read word lines;
  a source line decoder, configured to provide a bit line operating voltage and an induced current to n source lines; and
  a reading operation module, configured to read data stored in the memory array and perform a logical operation on the data stored in the memory array.

In an embodiment, the read operation module includes:
a current-type sense amplifier, including an input end, a reference end and an output end, wherein the input end of the current-type sense amplifier is connected to the bit line through the bit line decoder, and the reference end of the current-type sense amplifier is connected to the inverse bit line through the bit line decoder;
an adder, including an input end and an output end, wherein the input end of the adder is connected to the output end of the current-type sense amplifier; and
a register, connected to the output end of the adder.

In an embodiment, the read and write circuit is configured for a binary neural network.

DETAILED DESCRIPTION OF EMBODIMENTS

In order to make the objectives, features and advantages of the present disclosure more obvious and understandable, the technical solutions in the embodiments of the present disclosure will be clearly and completely described below in combination with the drawings in the embodiments of the present disclosure. Obviously, the described embodiments are only a portion of the embodiments of the present disclosure, but not all thereof. Based on the embodiments in the present disclosure, all other embodiments obtained by those skilled in the art without creative efforts belong to the protection scope of the present disclosure.

Figure 1:
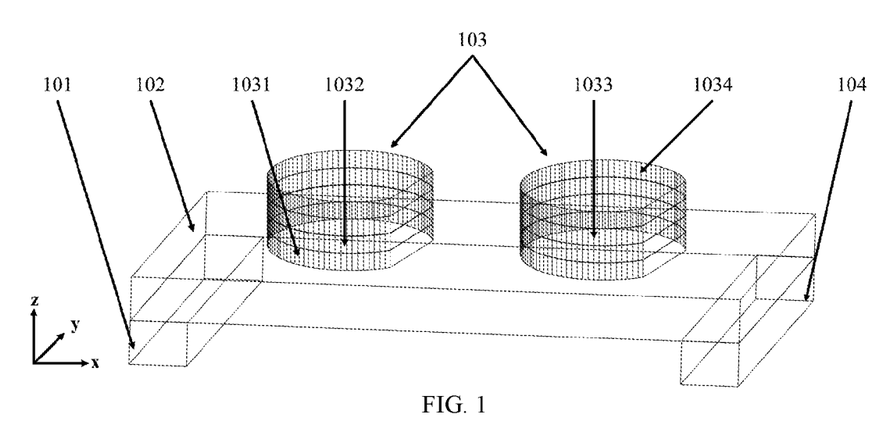
FIG. 1 is a schematic structural diagram of a spintronic device according to an embodiment of the present disclosure.

Referring to FIG. 1, FIG. 1 is a schematic structural diagram of a spintronic device according to an embodiment of the present disclosure. The spintronic device includes: a bottom electrode 101, 104; a spin orbit coupling layer 102, arranged on the bottom electrode 101, 104; at least one pair of magnetic tunnel junctions 103, arranged on the spin orbit coupling layer 102, wherein each of the magnetic tunnel junctions 103 comprises a free layer 1031, a tunneling layer 1032, and a reference layer 1033 arranged sequentially from bottom to top, and magnetization directions of reference layers 1033 of each pair of the magnetic tunnel junctions 103 are opposite; and a top electrode 1034, arranged on a reference layer 1033 of each of the magnetic tunnel junctions 103.

In an embodiment of the present disclosure, materials of the reference layer 1033 and the free layer 1031 are one or more of ferromagnetic materials having perpendicular magnetic anisotropy such as CoFeB and Co/Pt. The spin orbit coupling layer 102 is composed of one or more of heavy metals such as Pt, Ta, and W. The bottom electrode 101, 104 and the top electrode 1034 are composed of metals such as Ti/Au, Ti/Pt, Cr/Au and Ta/CuN. Furthermore, the tunneling layer 1032 is composed of MgO, $Al_2O_3$ and the like.

Figure 2:
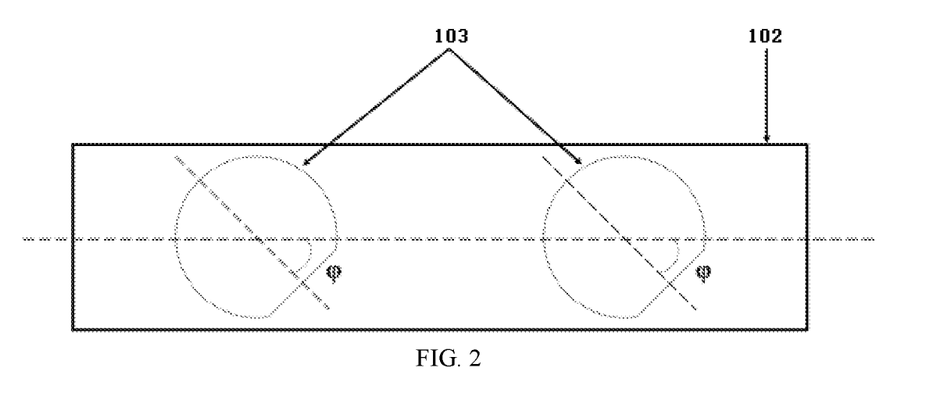
FIG. 2 is a top view of a spintronic device according to an embodiment of the present disclosure.

Referring to FIG. 2, FIG. 2 is a top view of a spintronic device according to an embodiment of the present disclosure.

In an embodiment of the present disclosure, a structure of each of the magnetic tunnel junctions 103 is a string-shaped structure, and an axis of a straight side of each of the magnetic tunnel junctions 103 forms a preset included angle φ with an axis of a length direction of the spin orbit coupling layer 102. Such asymmetric shape of the magnetic tunnel junction 103 will induce a certain shape anisotropy, combined with the DM antisymmetric exchange interaction, a field-free deterministic switching of the magnetic tunnel junction 103 may be implemented and a unipolar switching may also be implemented. When a current flows through the spin orbit coupling layer 102, due to the spin Hall effect of a heavy metal or the Rashaba effect of an interface, a spin current in a vertical direction will be generated, so that the free layer 1031 of the magnetic tunnel junction 103 is switched. As the magnetization directions of the reference layers 1033 of two magnetic tunnel junctions 103 are opposite, the two magnetic tunnel junctions 103 always store opposite resistance states.

In the present disclosure, preset included angles φ formed between axes of straight sides of two magnetic tunnel junctions 103 in a pair of magnetic tunnel junctions and the axis of the length direction of the spin orbit coupling layer 102 may be the same or complementary, which is not limited in the present disclosure.

Figure 3:
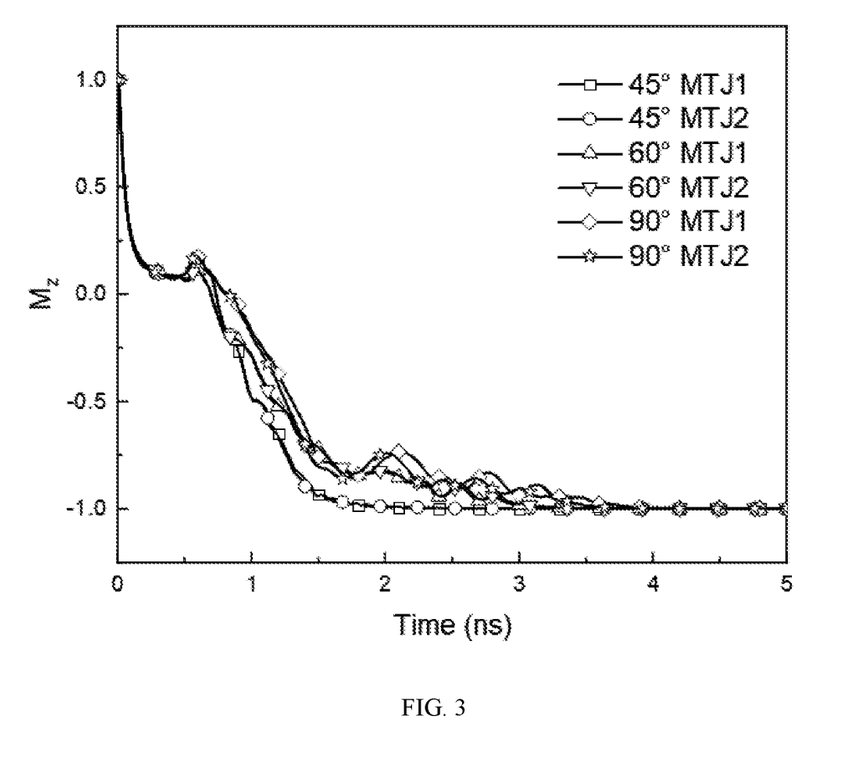
FIG. 3 is a magnetization switching curve of a spintronic device according to an embodiment of the present disclosure.

Referring to FIG. 3, FIG. 3 shows a magnetization switching curve of a spintronic device according to an embodiment of the present disclosure. Preset included angle φ of a pair of magnetic tunnel junctions 103 is sequentially set to be 45°, 60θ and 90°, and a current pulse with a pulse width of 0.5 ns and a density of $2 \times 10^8$ A/cm$^2$ is applied along an x-axis direction, thereby achieving a synchronous field-free deterministic switching of the pair of magnetic tunnel junctions 103.

Figure 4:
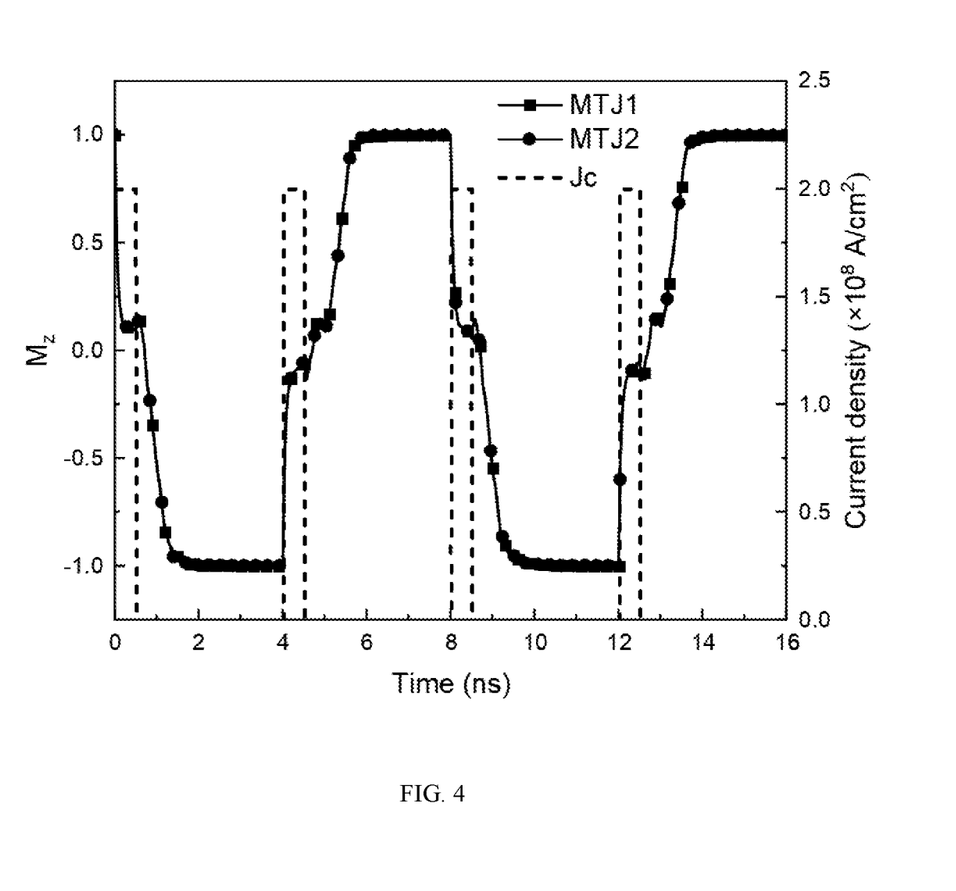
FIG. 4 is a synchronous switching curve of a unipolar pulse of a spintronic device according to an embodiment of the present disclosure.

Referring to FIG. 4, FIG. 4 shows a synchronous switching curve of a unipolar pulse of a spintronic device according to an embodiment of the present disclosure. A preset included angle φ of a pair of magnetic tunnel junctions 103 is set to be to 45°, and four unipolar current pulses with a pulse width of 0.5 ns and a density of $2 \times 10^8$ A/cm$^2$ are continuously applied along the x-axis direction, thereby achieving a synchronous repeated switching of two magnetic tunnel junctions 103. A unipolar current pulse is easy to operate and simplifies a peripheral driving circuit.

Figure 5:
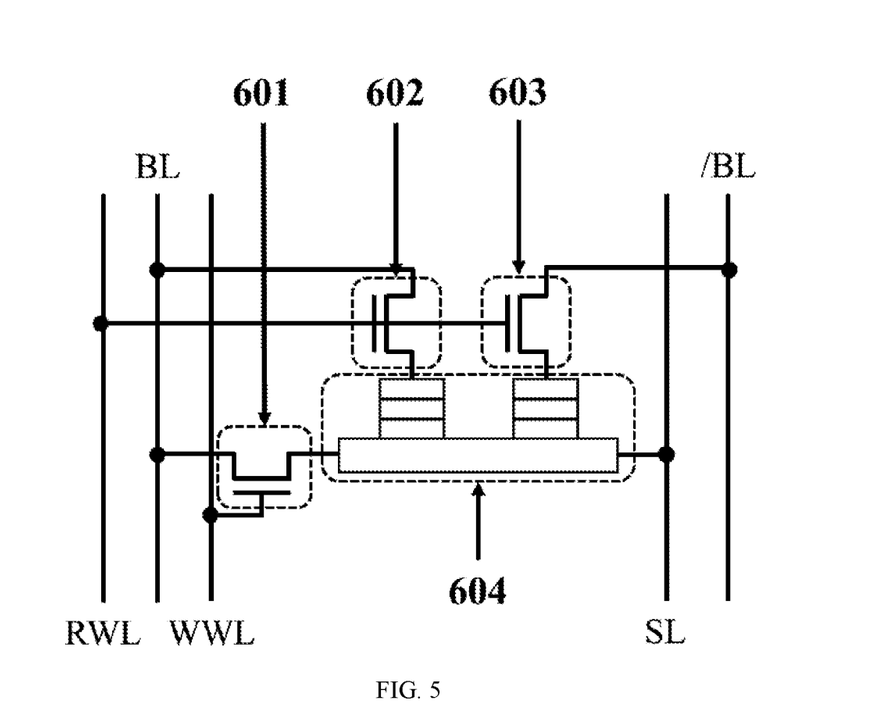
FIG. 5 is a schematic diagram of a memory cell according an embodiment of the present disclosure.

Referring to FIG. 5, FIG. 5 is a schematic diagram of a memory cell according to an embodiment of the present disclosure. The memory cell includes: the spintronic device 604 as shown in FIG. 1; a first transistor 601, including a first terminal, a second terminal and a third terminal, wherein the first terminal of the first transistor is connected to the bottom electrode 101, the second terminal of the first transistor is connected to a write word line WWL, the third terminal of the first transistor 601 is connected to a bit line BL, and the bottom electrode 104 is connected to a source line SL; a second transistor 602, including a first terminal, a second terminal and a third terminal, wherein the first terminal of the second transistor 602 is connected to one top electrode 1034 for a pair of magnetic tunnel junctions 103, the second terminal of the second transistor 602 is connected to a read word line RWL, and the third terminal of the second transistor 602 is connected to the bit line BL; and a third transistor 603, including a first terminal, a second terminal and a third terminal, wherein the first terminal of the third transistor 603 is connected to another top electrode 1034 for the pair of magnetic tunnel junctions, the second terminal of the third transistor 603 is connected to the read word line RWL, and the third terminal of the third transistor 603 is connected to an inverse bit line/BL.

In this embodiment, 601 may be regarded as a write control transistor, 602 and 603 may be regarded as read control transistors, and 604 is a spintronic device. When a reading operation is operated, the write word line WWL is pulled low to turn off the first transistor 601, the read word line RWL is pulled high to turn on the second transistor 602 and the third transistor 603, while the source line SL is grounded, and consequently the current flows through a pair of magnetic tunnel junctions 103 via the bit line BL and the inverse bit line/BL. The current on the bit line BL and the inverse bit line/BL flows into a current-type sense amplifier CSA to read a storage state of the spintronic device 604. When a writing operation is performed, the write word line WWL is pulled high to turn on the first transistor 601, the read word line RWL is pulled low to turn off the second transistor 602 and the third transistor 603 are turned off, while the source line SL is grounded, the current between the bit line BL and the source line SL flows through a current path of the spin orbit coupling layer 102, and the resistance state of the magnetic tunnel junction 103 is switched, thereby achieving the writing of the resistance state.

Figure 6:
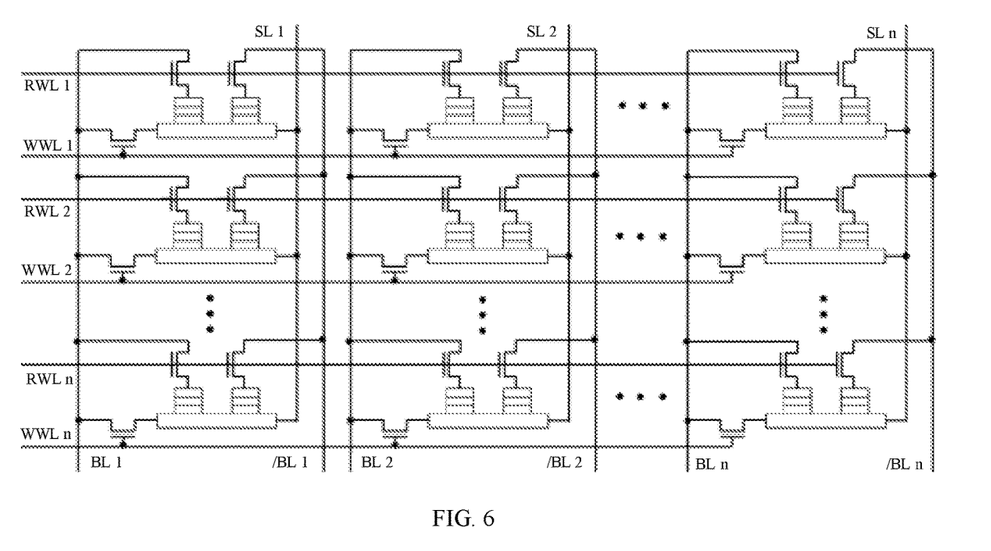
FIG. 6 is a schematic diagram of a memory array according to an embodiment of the present disclosure.

Referring to FIG. 6, FIG. 6 is a schematic diagram of a memory array according to an embodiment of the present disclosure. The memory array includes: m write word lines, m read word lines, n source lines, and m rows and n columns of memory cells, wherein the memory cell is the memory cell as shown in FIG. 5, each of m and n is a positive integer; a bit line for each of the memory cells in a same column is connected to a same bit line, and an inverse bit line for each of the memory cells in a same column is connected to s same inverse bit line; and a write word line for each of the memory cells in a same row is connected to a same write word line, and a read word line for each of the memory cells in a same column is connected to a same read word line.

Figure 7:
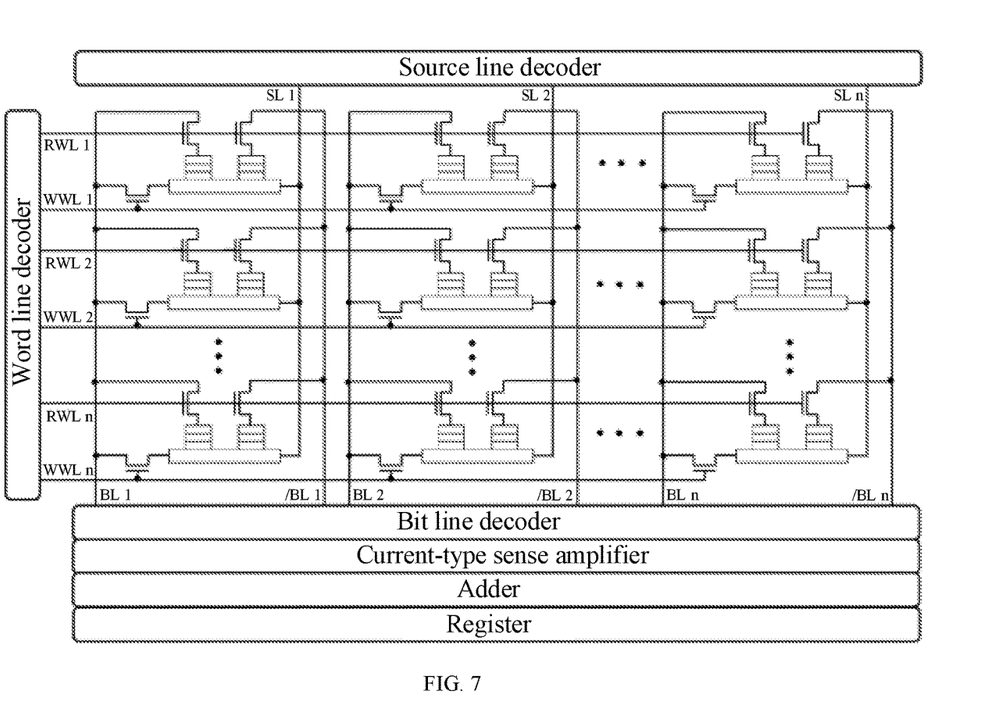
FIG. 7 is a schematic diagram of a read and write circuit according to an embodiment of the present disclosure.

Referring to FIG. 7, FIG. 7 is a schematic diagram of a read and write circuit according to an embodiment of the present disclosure. The read and write circuit includes:
 the memory array as shown in FIG. 6;
 a bit line decoder, used to provide a bit line operating voltage to n bit lines and n inverse bit lines;
 a word line decoder, used to provide a word line operating voltage to m write word lines and m read word lines;
 a source line decoder, used to provide a bit line operating voltage and an induced current to n source lines; and
 a reading operation module, used to read data stored in the memory array and perform a logical operation on the data stored in the memory array.

In the present embodiment, at the algorithm level, the high resistance state and the low resistance state are respectively mapped to be (+1, 0). When a preceding stage input is a high level, according to the difference between the currents on the bit line BL and the inverse bit line/BL, a multiplication operation result may be output and input into an adder and a register; when the preceding stage input is a low level, no output will be generated, i.e., the output is a low level. After a series of multiplication and addition operations, a matrix-vector multiplication operation may be achieved for a binary neural network.

In an embodiment, the reading operation module includes: a current-type sense amplifier, including an input end, a reference end and an output end, wherein the input end of the current-type sense amplifier is connected to the bit line through the bit line decoder, and the reference end of the current-type sense amplifier is connected to the inverse bit line through the bit line decoder; an adder, including an input end and an output end, wherein the input end of the adder is connected to the output end of the current-type sense amplifier; and a register, connected to the output end of the adder.

Furthermore, it is also possible that the reference end of the current-type sense amplifier is connected to the bit line through the bit line decoder, and the input end of the current-type sense amplifier is connected with the inverse bit line through the bit line decoder, which is not limited by the present disclosure.

It may be known from the above embodiments of the present disclosure that the spintronic device, the memory cell, the memory array, and the read and write circuit provided by the present disclosure may, on one hand, achieve a deterministic magnetization switching driven by a unipolar current pulse without an external magnetic field. On another hand, the magnetization directions of the reference layers of two magnetic tunnel junctions of each pair of magnetic tunnel junctions are opposite, thereby ensuring that the two magnetic tunnel junctions are always in opposite resistance states, thereby achieving a self-reference and improving a reading margin. On yet another hand, the constructed memory array may achieve a matrix-vector multiplication operation in combination with an external circuit.

It should be noted that various functional modules in various embodiments of the present disclosure may be integrated into one processing module, or various modules may exist in a separately physical manner, or two or more modules may be integrated into one module. The above integrated modules may be implemented in the form of hardware or in the form of software functional modules.

If the integrated modules are implemented in the form of software functional modules and sold or used as independent products, they may be stored in a computer readable storage medium. Based on such an understanding, the essence of the technical solution of the present invention or the portion thereof that contributes to the prior art or all or a portion of the technical solution may be embodied in the form of software products.

It should be noted that, for the sake of simple description, various method embodiments described above are expressed as a series of action combinations, but those skilled in the art should know that the present disclosure is not limited by the described action sequences, because according to the present disclosure, certain steps may be performed in other sequences or simultaneously. Then, those skilled in the art should also know that the embodiments described in the specification belong to preferred embodiments, and the actions and modules involved are not necessarily required in the present disclosure.

In the above embodiments, the descriptions of various embodiments have their own emphases, and for portions not described in detail in a certain embodiment, reference may be made to relevant descriptions of other embodiments.

The above is a description of a spintronic device, a memory cell, a memory array, and a read and write circuit according to the present disclosure. Based on the concept of the embodiments of the present disclosure, those skilled in the art may make modifications to both the specific implementations and the application scopes. In summary, the contents of the present specification should not be construed as limiting the present disclosure.

What is claimed is:

1. A read and write circuit, comprising:
a memory array that comprises:
- m write word lines, m read word lines, n source lines, and m rows and n columns of memory cells, wherein each of m and n is a positive integer, and each memory cell comprises:
  - a spintronic device that comprises:
    - a bottom electrode;
    - a spin orbit coupling layer arranged on the bottom electrode;
    - at least one pair of magnetic tunnel junctions arranged on the spin orbit coupling layer, wherein each of the magnetic tunnel junctions comprises a free layer, a tunneling layer, and a reference layer arranged sequentially from bottom to top, and magnetization directions of the reference layers of two the magnetic tunnel junctions making up each pair of the magnetic tunnel junctions are opposite; and
    - a top electrode, arranged on the reference layer of each of the magnetic tunnel junctions;
  - a first transistor comprising a first terminal, a second terminal and a third terminal, wherein the first terminal of the first transistor is connected to the bottom electrode, the second terminal of the first transistor is connected to a write word line, the third terminal of the first transistor is connected to a bit line, and the bottom electrode is connected to a source line;
  - a second transistor comprising a first terminal, a second terminal and a third terminal, wherein the first terminal of the second transistor is connected to a first top electrode for the pair of magnetic tunnel junctions, the second terminal of the second transistor is connected to a read word line, and the third terminal of the second transistor is connected to the bit line; and
  - a third transistor comprising a first terminal, a second terminal and a third terminal, wherein the first terminal of the third transistor is connected to a second top electrode for the pair of magnetic tunnel junctions, the second terminal of the third transistor is connected to the read word line, and the third terminal of the third transistor is connected to an inverse bit line;
- wherein a bit line for each of the memory cells in a same column is connected to a same bit line, and an inverse bit line for each of the memory cells in a same column is connected to a same inverse bit line; and
- wherein a write word line for each of the memory cells in a same row is connected to a same write word line, and a read word line for each of the memory cells in a same column is connected to a same read word line;
- a bit line decoder, configured to provide a bit line operating voltage to n bit lines and n inverse bit lines;
- a word line decoder, configured to provide a word line operating voltage to m write word lines and m read word lines;
- a source line decoder, configured to provide a bit line operating voltage and an induced current to n source lines; and
- a reading operation module, configured to read data stored in the memory array and perform a logical operation on the data stored in the memory array;
- wherein the read and write circuit is configured for a binary neural network.

2. The read and write circuit according to claim 1, wherein in the spintronic device of each memory cell, a structure of each of the magnetic tunnel junctions is a string-shaped structure.

3. The read and write circuit according to claim 2, wherein in the spintronic device of each memory cell, an axis of a straight side of each of the magnetic tunnel junctions forms a preset included angle with an axis of a length direction of the spin orbit coupling layer.

4. The read and write circuit according to claim 1, wherein in the spintronic device of each memory cell, the bottom electrode comprises:
- a first electrode connected to a first end of the spin orbit coupling layer; and
- a second electrode connected to a second end of the spin orbit coupling layer;
- wherein the first end and the second end of the spin orbit coupling layer are arranged opposite to each other.

5. The read and write circuit according to claim 1, wherein in the spintronic device of each memory cell, a material of the spin orbit coupling layer is a heavy metal material.

6. The read and write circuit according to claim 1, wherein the reading operation module comprises:
- a current-type sense amplifier comprising an input end, a reference end and an output end, wherein the input end of the current-type sense amplifier is connected to the bit line through the bit line decoder, and the reference end of the current-type sense amplifier is connected to the inverse bit line through the bit line decoder;
- an adder comprising an input end and an output end, wherein the input end of the adder is connected to the output end of the current-type sense amplifier; and
- a register connected to the output end of the adder.

* * * * *